(12) United States Patent
Ureshino (10) Patent No.: US 6,344,815 B2
(45) Date of Patent: *Feb. 5, 2002

(54) DIGITAL-TO-ANALOG CONVERTER

(75) Inventor: Yoshimichi Ureshino, Miyazaki (JP)

(73) Assignee: OKI Electric Industry Co., Ltd., Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/532,040

(22) Filed: Mar. 21, 2000

(30) Foreign Application Priority Data

Oct. 14, 1999 (JP) .......................... 11-291949

(51) Int. Cl.$^7$ ............................... H03M 1/66
(52) U.S. Cl. ..................... 341/144; 341/148
(58) Field of Search ................ 341/144, 148, 341/153, 154

(56) References Cited

U.S. PATENT DOCUMENTS 5,745,065 A * 4/1998 Wu ..................... 341/144

* cited by examiner

Primary Examiner—Peguy JeanPierre
Assistant Examiner—Jean Bruner JeanGlaude
(74) Attorney, Agent, or Firm—Volentine Francos, PLLC (57) ABSTRACT

A D/A converter of low distortion factor includes a plurality of voltage dividing resistances formed on a P-type semiconductor substrate and connected in series with each other between power source voltage and ground. One of plural N-channel MOS transistors used as switching elements is selected in correspondence with a decoding result of a decoder, and the selected transistor is connected between an output node and a corresponding tap provided on a current path made up of plural voltage dividing resistances. Since the N-channel MOS transistors are formed directly on the P-type substrate, the voltage dividing resistances are not arranged near an N-type well region. The voltage dividing resistances therefore have uniform resistive value, so that D/A conversion with low distortion factor is realized.

12 Claims, 5 Drawing Sheets

DIGITAL-TO-ANALOG CONVERTER

BACKGROUND OF THE INVENTION

1. Field of the Invention

The present invention relates to a digital-to-analog converter (referred to as "D/A converter" hereinafter), which is formed on a semiconductor substrate including a plurality of N-channel type MOS transistors and P-channel type MOS transistors as well and converts an input digital data into an analog voltage signal. In the following description, the plural form of the n-channel MOS transistor and the plural form of the p-channel MOS transistor will be expressed as "NMOS'" and "PMOS'", respectively, while the single form of them will be expressed as "NMOS" and "PMOS", respectively.

2. Prior Art

Figure 2:
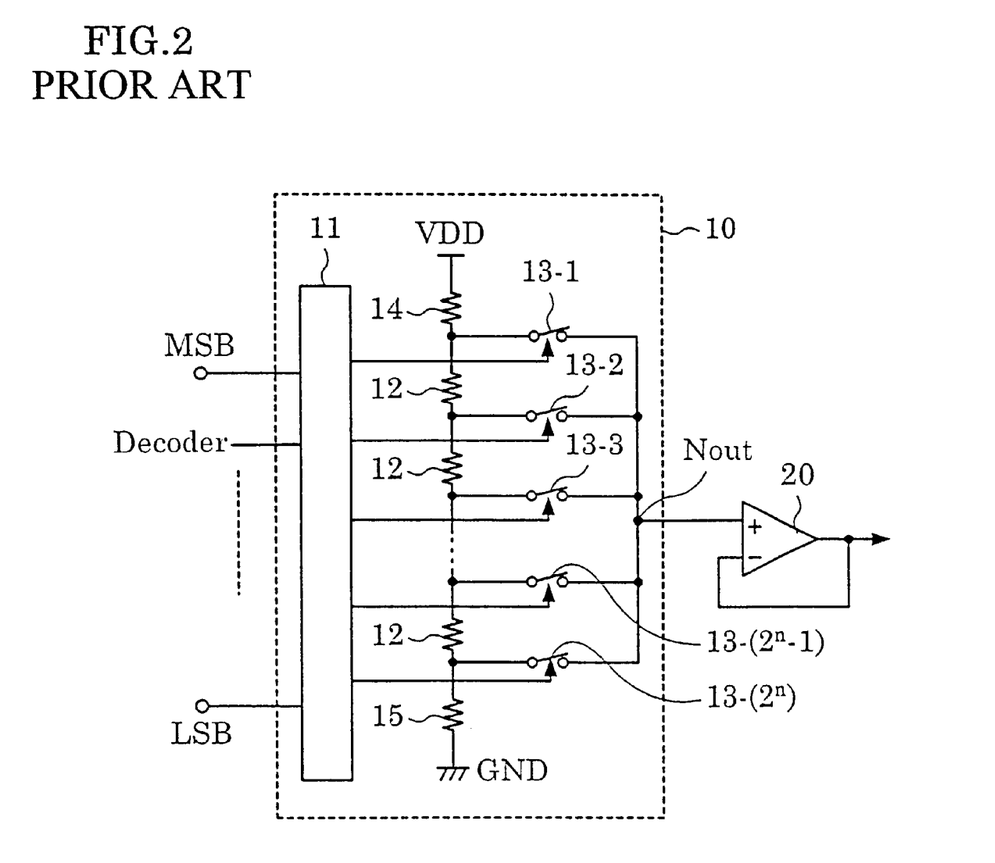
FIG. 2 is a diagram showing a schematic configuration of a prior art voltage potentiometer type D/A converter.

FIG. 2 is a schematic representation indicating the configuration of a prior art D/A converter of the voltage potentiometer type.

This voltage potentiometer type D/A converter is known as one of the D/A converters which are formed on the semiconductor substrate including NMOS' and PMOS'. As shown in FIG. 2, the D/A converter 10 of the voltage potentiometer type for converting the digital data of n-bit into the analog voltage includes a decoder 11 for decoding the digital data of n-bit, and a plurality of voltage dividing resistances 12 which are connected in series with each other between the power source voltage VDD and the ground GND, each of resistances 12 being provided with a plurality of taps. The number of taps required for processing the digital data of n-bit can be expressed as $2^n$ (n: integer). Accordingly, the taps of 1024 is needed for processing the digital data of 10-bit, for instance. Furthermore, switches of $2^n$ i.e. 13-1, 13-2, ..., 13-($2^n$-1), and 13-($2^n$) are connected in parallel with each other between the voltage output node Nout and each of the taps of $2^n$. These switches 13-1 through 13-($2^n$) are selectively turned on in correspondence with the decoding result of the decoder 11 and then transmit the voltage generated at each voltage dividing resistance 12 to the node Nout.

It might be preferable to make up each of switches 13-1 through 13-($2^n$) of a pair of PMOS and NMOS from the point of view of suppressing the level loss to the minimum. However, this is not always preferable but rather disadvantageous from the point of view of reduction in the area of an LSI chip. For this reason, in general, the PMOS is used for transmission of the high voltage while the NMOS is used for transmission of the low voltage. Accordingly, each of switches 13-1 through 13-($2^n$) is made up of the PMOS or NMOS, because the PMOS is hard to transmit the low voltage while the NMOS is hard to transmit the high voltage. Furthermore, resistances 14 and 15 are connected with both ends of serial resistances 12, respectively, the resistance 14 having the function of lowering the power source voltage VDD and giving the lowered voltage to the serial voltage dividing resistance 12 and the resistance 15 having the function of raising the ground voltage and giving the raised voltage to the serial voltage dividing resistance 12. The voltage range of the node Nout is determined by these resistances 14 and 15. Each of resistances 12 is made of polycrystalline silicon (referred to as "poly-silicon" hereinafter) which is hard to be influenced by the other node. All the resistances 12 are formed so as to have an equal resistive value, thereby the less distorted voltage being outputted to the node Nout.

However, the prior art D/A converter as shown in FIG. 2 included the following problems to be solved.

Figure 3:
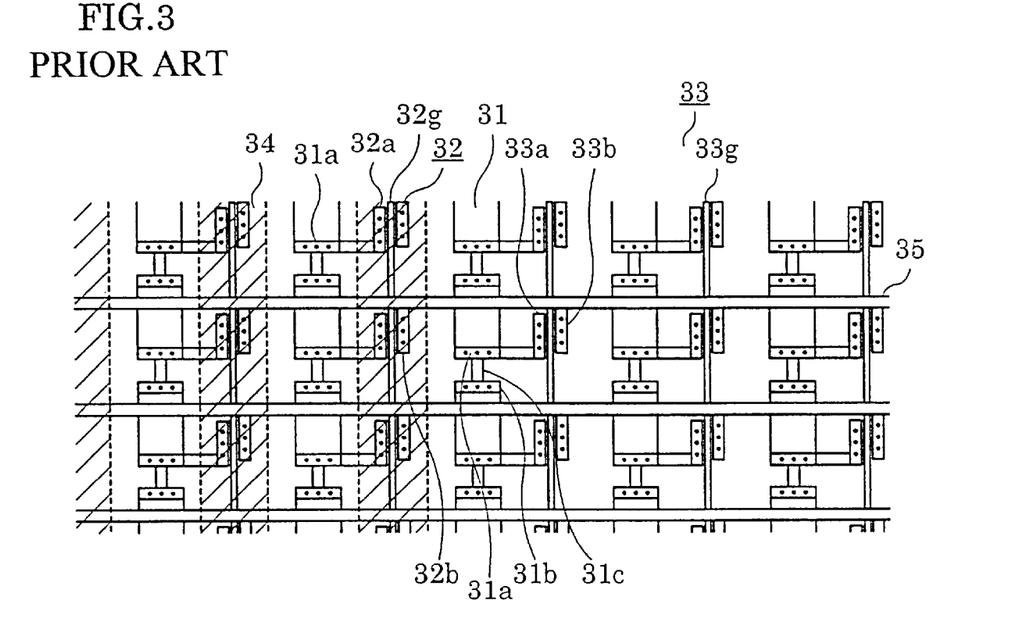
FIG. 3 is a diagram showing an example of the layout with respect to a resistance group and a switch group which make up the D/A converter as shown in FIG. 2.

FIG. 3 is an illustration for showing an example of the layout with respect to the resistance group and the switch group as shown in FIG. 2.

The layout as shown in FIG. 3 is obtained by arranging, in a matrix form, a plurality of resistances 31 made of poly-silicon corresponding to the resistances 12 in FIG. 2 and a plurality of PMOS' 32 and NMOS' 33 corresponding to switches 13-1 through 13-($2^n$) in FIG. 2. A plurality of columns made up of PMOS' 32 are arranged in the region of an N-type well 34 formed on a P-type silicon substrate while a plurality of columns made up of NMOS' 33 are arranged directly on the P-type silicon substrate. Gates 32g of PMOS' 32 belonging to one column are interconnected with each other, thereby functioning as a common gate. Gates 33g of NMOS' 33 belonging to one column are also interconnected with each other, thereby functioning as a common gate. The column composed of resistances 31 made of poly-silicon is formed so as to intervene between adjacent columns made up of transistors (PMOS' or NMOS'). Contacts 31a and 31b are formed such that they are connected with both ends of each resistance 31, respectively. The contact 31a of each resistance 31 and the contact 31b of the resistance 31 adjacent thereto are connected with each other through a pattern 31c. With this connection, the resistances 31 on one column of the matrix are connected in series with each other. The contact 31a of each resistance 31 is connected with the source 32a of the PMOS 32 located at the right hand of the resistance 31 or with the drain 33a of the NMOS 33 located at the same. The drain 32b of the PMOS 32 and the source 33b of the NMOS 33 are connected with a pattern 35, wherein the PMOS 32 and NMOS 33 are on the same row of the matrix and the pattern 35 is provided for every row of the matrix. In case of arranging PMOS' 32 and NMOS' 33 in the matrix form like the above, it is required for two selection switches (not shown) to be additionally provided, that is, one for selecting the gate 32g of the PMOS 32 or the gate 33g of the NMOS 33 and the other for selecting the pattern 35. Despite of the addition of these switches, there might be attained a certain advantage from the point of view of reducing the area of the LSI chip.

In case of having actually carried out this matrix arrangement, however, a step portion was created due to a very small height (thickness) difference between the region of the N-type well 34 and the P-type semiconductor substrate region other than the N-type well region. This step portion may affect the refractive index of the light. Therefore, if it is tried to make the semiconductor integrated circuit more compact, in other words, if trying to enhance the degree of integration of the semiconductor integrated circuit, the width of the finished poly-silicon i.e. the finished resistance 31 is made different depending on the place it is formed. Especially, the width of the finished resistance formed in or near the N-type well 34 is considerably made different from that of the formed outside the N-type well region 34. Difference in the width of the finished resistance 31 makes worse the frequency distortion factor caused in the D/A conversion process. For instance, if the width difference of 1/100 is caused between finished resistances 31, it is considered in general that the frequency distortion factor would be 0.5 per cent.

SUMMARY OF THE INVENTION

In order to solve the problems as have been discussed above, according to the first aspect of the invention, there is provided a D/A converter which is formed on a semiconductor substrate including a plurality of NMOS' and PMOS' and converts an input digital data into an analog voltage signal. This D/A converter includes a decoder for decoding the digital data; a voltage setting resistance connecting one end thereof with a power source and outputting, from the other end thereof, a set voltage which is obtained by dropping the voltage outputted by the power source; a plurality of voltage dividing resistances connected in series with each other between the other end of the voltage setting resistance and the ground; a plurality of NMOS' which are connected between a voltage output node and a plurality of taps provided on a current path made up of the voltage setting resistance and the plural voltage dividing resistances, and are selectively turned on in correspondence with the decoding result of the decoder, thereby transmitting the voltage on the connected tap to the voltage output node; and a level shift circuit shifting the voltage at the voltage output node and generating the analog voltage signal.

With adoption of such a configuration as mentioned above, it will be no longer needed to form any PMOS as a voltage dividing resistance in the N-type well region. In other words, there is no need for the voltage dividing resistance to be arranged near the boundary between the P-type semiconductor substrate and the N-type well region formed thereon, thus the voltage dividing resistance being not affected by the step portion created at the boundary and being formed having a uniform width. Accordingly, there can be realized the unification of the resistive value with respect to each of voltage dividing resistances.

Furthermore, according to the second aspect of the invention, there is provided a D/A converter formed on a semiconductor substrate including a plurality of NMOS' and PMOS' and having the following configuration, which includes a decoder for decoding the digital data; a voltage setting resistance connecting one end thereof with the ground and outputting, from the other end thereof, a set voltage which is obtained by raising the voltage of the ground; a plurality of voltage dividing resistances connected in series with each other between the other end of the voltage setting resistance and the power source; a plurality of PMOS' which are connected between a voltage output node and a plurality of taps provided on a current path made up of the voltage setting resistance and the plural voltage dividing resistances, and are selectively turned on in correspondence with the decoding result of the decoder, thereby transmitting the voltage on the connected tap to the voltage output node; and a level shift circuit shifting the voltage at the voltage output node and generating the analog voltage signal.

With adoption of such a configuration as described above, it is made possible to make up the voltage dividing resistances by using only PMOS' formed in the N-type well region, thus the condition of manufacturing the voltage dividing resistance being unified. As the result of this, there can be realized the unification of the resistive value with respect to each of voltage dividing resistances.

Still further, according to the third aspect of the invention, there is provided a D/A converter formed on a semiconductor substrate including a plurality of NMOS' and PMOS', and having the following configuration which includes a decoder for decoding the digital data; a plurality of the first voltage dividing resistances connected in series with each other between the power source and a mid node between the power source and the ground; a plurality of the second voltage dividing resistances connected in series with each other between the mid node and the ground; a fixed voltage supply means for supplying the fixed voltage to the mid node; a plurality of PMOS' which are connected between a voltage output node and a plurality of taps provided on a current path made up of the plural first voltage dividing resistances, and are selectively turned on in correspondence with the decoding result of the decoder, thereby transmitting the voltage on the connected tap to the voltage output node; and a plurality of NMOS' which are connected between the voltage output node and a plurality of taps provided on a current path made up of the plural second voltage dividing resistances, and are selectively turned on in correspondence with the decoding result of the decoder, thereby transmitting the voltage on the connected tap to the voltage output node.

With adoption of such a configuration as described above, even if the resistive value of the first voltage dividing resistance is different from that of the second voltage dividing resistance, the voltage of the mid node is fixed to the fixed voltage by the fixed voltage supply means. Consequently, the first voltage dividing resistances divide the potential difference between the power source voltage and the fixed voltage while the second voltage dividing resistances divide the potential difference between the fixed voltage and the ground voltage.

BRIEF DESCRIPTION OF THE DRAWINGS

Preferred embodiments according to the invention will now be described in detail with reference to the accompanying drawings, in which.

PREFERRED EMBODIMENTS OF THE INVENTION

[First Embodiment]

Figure 1:
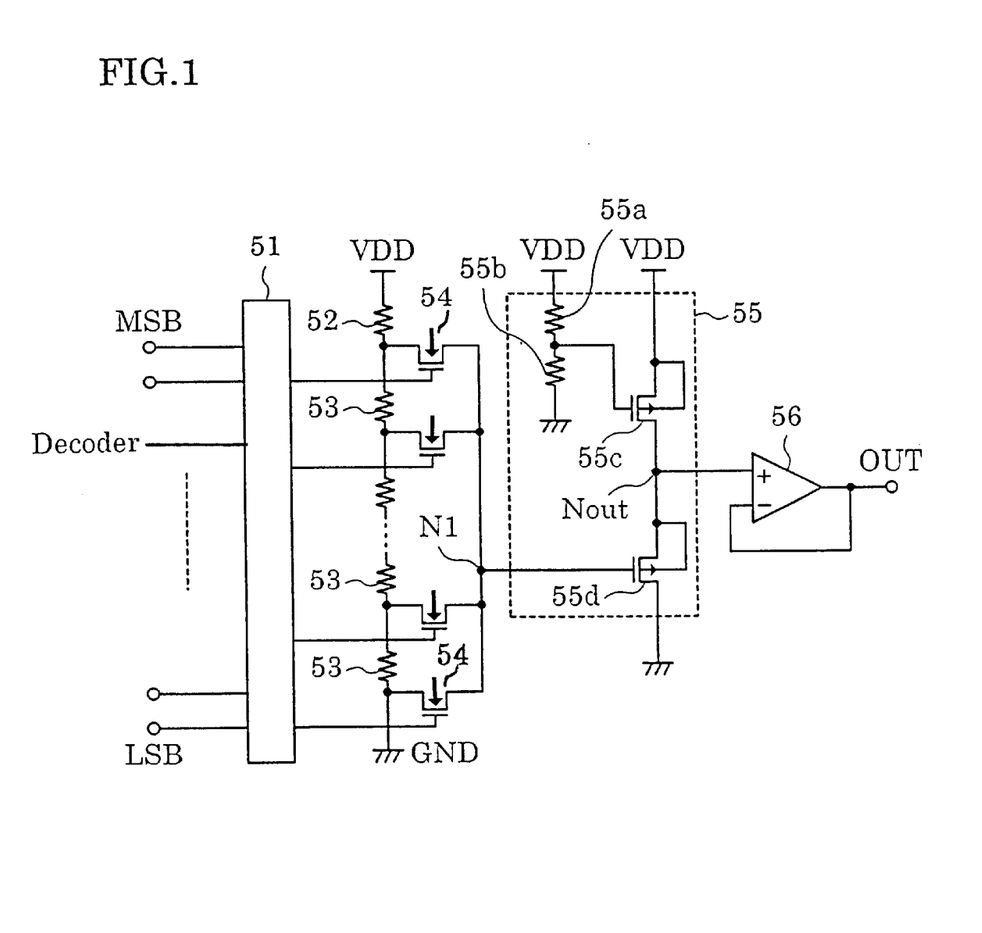
FIG. 1 is a diagram showing a configuration of a D/A converter according to the first embodiment of the invention.

FIG. 1 is a diagram for showing the configuration of a D/A converter according to the first embodiment of the invention. This D/A converter includes a decoder 51 decoding a digital data of n-bit as inputted thereto and a voltage setting resistance 52, of which one end is connected with a power source voltage VDD, thereby the power source voltage VDD being dropped to the voltage VDD/2, for instance, and this voltage VDD/2 being outputted as a set voltage from the other end of the resistance 52.

A plurality of voltage dividing resistances 53 made of poly-silicon are connected in series with each other between the resistance 52 and the ground GND. A plurality of taps of $2^n$ (n: integer) are arranged between serial resistances 53. Furthermore, a plurality of NMOS' 54 are connected in parallel with each other between each of taps of $2^n$ and a voltage output node N1. When any one of plural NMOS' 54 is selected and turned on in correspondence with the decoding result of the decoder 51, a voltage is supplied from the node N1 to a level shift circuit 55.

This level shift circuit 55 includes resistances 55a and 55b, a PMOS 55c, and a PMOS 55d. Resistances 55a and 55b are connected in series with each other between the power source voltage VDD and the ground GND. The gate of the PMOS 55c is connected with the junction point between resistances 55a and 55b while the source of the PMOS 55c is connected with a power source voltage VDD. The source of the PMOS 55d is connected with the drain of the PMOS 55c while the drain of the PMOS 55d is connected with the ground GND. The resistive value of the resistance 55a is one third (⅓) of the resistance 55b. The gate of the PMOS 55d is connected with the node N1 to receive the voltage supplied therefrom. The drain of the PMOS 55c and the source of the PMOS 55d are connected with a node Nout which outputs an analog voltage. Furthermore, this node Nout is connected with the non-inverting input terminal of an operational amplifier 56 which may be provided as the need arises. The output terminal OUT of the operational amplifier 56 is connected with the inverting input terminal of the same for negative feedback.

Now, the operation of the D/A converter shown in FIG. 1 will be described in the following. The digital data of n-bit is inputted to the decoder 51. The decoder 51 decodes the digital data as inputted thereto and selects one of NMOS' 54. With this, the NMOS 54 selected by the decoder 51 is turned on, thereby the tap connected therewith and the node N1 being short-circuited. When the current flows through the resistance 52 and a plurality of voltage dividing resistances 53 which are connected in series with each other between the power source voltage VDD and the ground GND, the resistance 52 of which one end is connected with the power source voltage VDD, outputs the voltage VDD/2 for instance, from the other end thereof. Furthermore, each of voltage dividing resistances 53 outputs, via each of taps, the voltage which is obtained by dividing the potential difference (i.e. VDD/2) between the other end of the resistance 52 and the ground GND.

The voltage at the node N1 is applied to the gate of the PMOS 55d arranged in the level shift circuit 55. The conductive state (ON resistance) of the PMOS 55d varies the voltage at the node Nout, so that the voltage at the node Nout comes to take a value corresponding to the digital data. The operational amplifier 56 works to stabilize the voltage at the node Nout and output it to the external portion.

Figure 4:
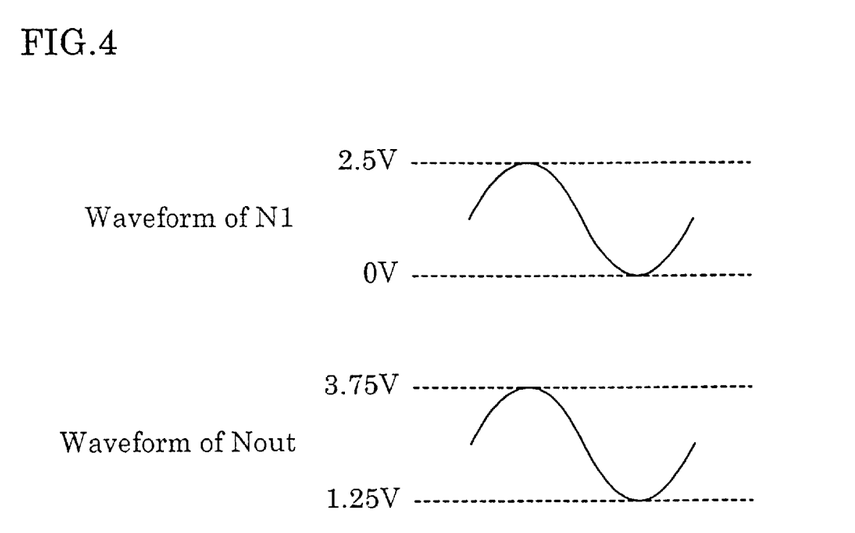
FIG. 4 is a waveform illustration for describing the operation of the D/A converter as shown in FIG. 1.

FIG. 4 shows the operational waveform of the D/A converter as shown in FIG. 1. When the digital data as inputted in sequence corresponds to a sine wave with an amplitude of 1.25V through 3.75V for instance, the voltage of 0V through 2.5V comes to appear at the node N1 due to the voltage setting resistance 52. This voltage of the node N1 may be appropriate for passing through the NMOS 54. However, since this voltage is too low to function as an analog voltage after the D/A conversion, the level shift circuit 55 shifts the voltage of the node N1. As the result of this shift operation by the level shift circuit 55, the sinusoidal voltage with the amplitude of 1.25V through 3.75V is outputted from the node Nout, and this sinusoidal voltage is outputted as the analog data through the operational amplifier 56.

As has been discussed above, the D/A converter according to the first embodiment of the invention includes the decoder 51, the voltage setting resistance 52 connected with the power source voltage VDD, a plurality of voltage dividing resistances 53 connected in series with the voltage setting resistance 52, a plurality of NMOS' 54 of $2^n$ which are connected between each tap and the voltage output node N1 and are selectively turned on or off in correspondence with the decoding result of the decoder 51, thereby outputting the tap voltage to the voltage output node N1, and the level shift circuit 55. Especially, since the ON-OFF switching operation between each tap and the voltage output node N1 is all carried out only by means of the NMOS 54, the voltage dividing resistances 53 can be formed only in the P-type region of the P-type semiconductor substrate. Consequently, there is no need for the resistance 53 to be formed in the N-type region such as an N-type well region. In short, the voltage dividing resistance 53 can be formed without being affected by the step portion created between the P-type semiconductor substrate and the N-type well region formed thereon, thus enabling the resistance 53 to be formed with a uniform width. Thus, the D/A converter according to the first embodiment can suppress the distortion factor caused in the D/A conversion process to a sufficiently small value.

[Second Embodiment]

Figure 5:
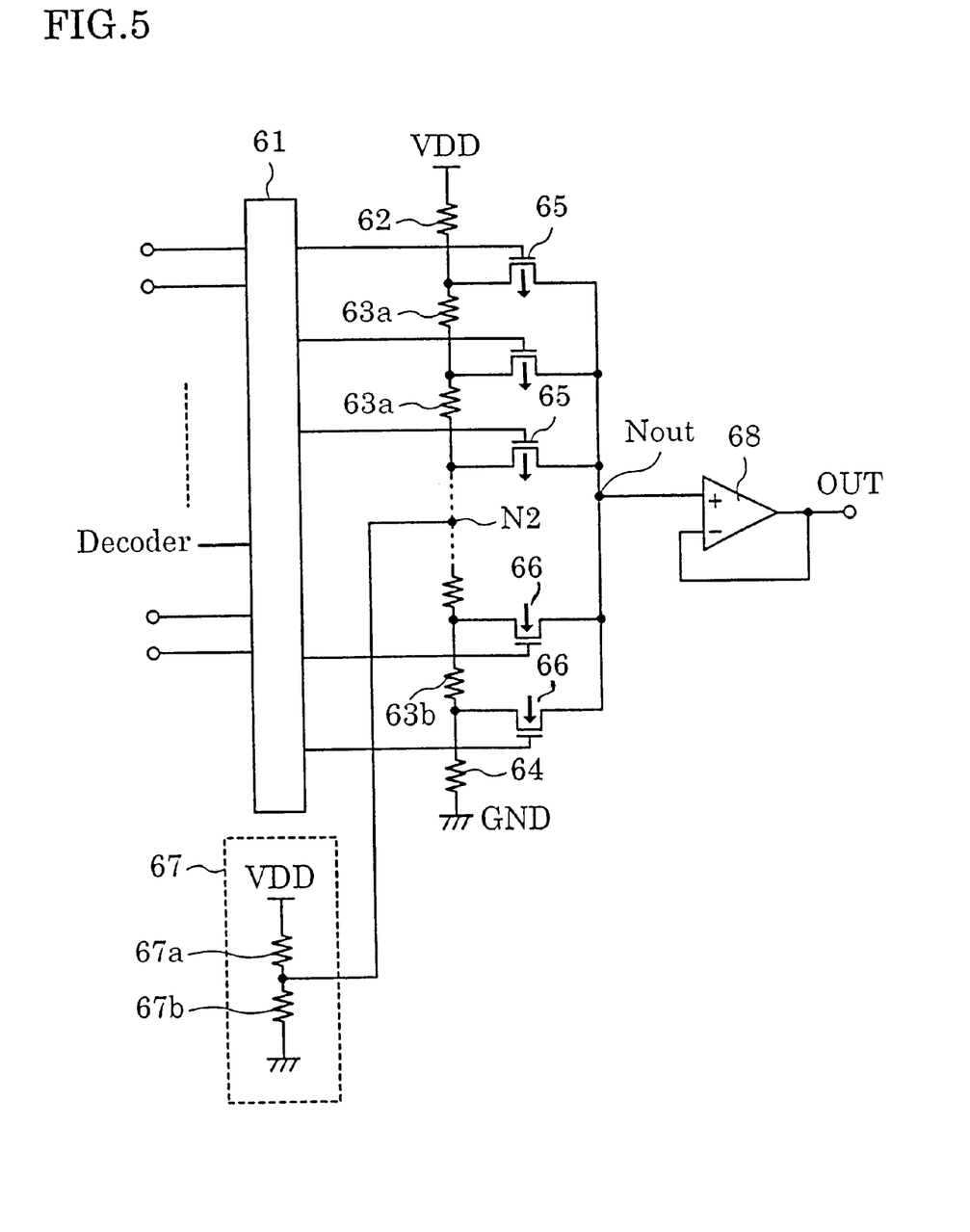
FIG. 5 is a diagram showing the configuration of the D/A converter according to the second embodiment of the invention.

FIG. 5 is a diagram illustrating the configuration of a D/A converter according to the second embodiment of the invention.

In the D/A converter according to the first embodiment as has been discussed above, it is made possible to form the voltage dividing resistance made of poly-silicon, without being affected by the step portion created due to the height difference between the P-type semiconductor substrate and the N-type well region formed thereon. As the result of this, the width of the voltage dividing resistance is made uniform, and there can be realized the D/A conversion of a less distortion factor. In contrast with this, in the D/A converter according to the second embodiment, a fixed voltage is given to the middle point of the current path made up of voltage divisional resistances, thereby suppressing the distortion factor caused in the D/A conversion process to a smaller value.

The D/A converter as shown in FIG. 5 includes a decoder 61 having almost same configuration and function as the decoder 51 arranged in the D/A converter according to the first embodiment, a resister 62 connecting its one end with the power source voltage VDD and working to set the maximum value of the analog voltage, a plurality of first voltage dividing resistances 63a, a plurality of second voltage dividing resistances 63b, and a resistance 64 connecting its one end with the ground GND and working to set the minimum value of the analog voltage. These resistances 62, 63a, 63b, and 64 are respectively made of poly-silicon which is deposited on the P-type semiconductor substrate through an insulating film. A plurality of resistances 63a are connected in series with each other between the other end of the resistance 62 and a mid node N2 between the power source voltage VDD and the ground GND. On one hand, a plurality of resistances 63b are connected in series with each other between the other end of the resistance 64 and the mid node N2. A current path is defined by these resistances 62, 63a, 63b, and 64. This current path includes a plurality of taps of which the number is $2^n$. A plurality of PMOS' 65 of $2^n/2$ are connected in parallel with each other between the taps of $2^n/2$ among these taps of $2^n$ on the side near the power source voltage VDD and the voltage output node Nout. Furthermore, a plurality of NMOS' 66 of $2^n/2$ are connected in parallel with each other between the remaining taps of $2^n/2$ on the side near the ground GND and the voltage output node Nout.

Still further, there is provided in this D/A converter a fixed voltage supply means 67 for supplying a fixed voltage to the mid node N2. For instance, this fixed voltage supply means 67 may be formed by using a resistance 67a connecting its one end with the power source voltage VDD and a resistance 67b connected between the other end of the resistance 67a and the ground GND. The fixed voltage (e.g. VDD/2) is supplied to the node N2 from the junction point between the resistances 67a and 67b.

Furthermore, the voltage output node Nout is connected with the non-inverting input terminal (+) of an operational amplifier 68. The output terminal OUT of the operational amplifier 68 is connected with the inverting input terminal of the same for negative feedback.

Now, the operation of the D/A converter as shown in FIG. 5 will be described in the following.

The decoder 61 decodes the digital data of the n-bit supplied in sequence and selects one of PMOS' 65 or NMOS' 66. The PMOS 65 or NMOS 66 selected by the decoder 61 is then turned on, thereby the tap and the node Nout being short-circuited. On one hand, the fixed voltage supply means 67 supplies a fixed voltage (e.g. VDD/2) which is set by resistances 67a and 67b, to the mid node N2, thus the voltage at the mid node N2 being fixed to the voltage of VDD/2. Voltage dividing resistances 63a and the resistance 62 divides the potential difference (VDD/2) between the power source voltage VDD and the fixed voltage VDD/2 and outputs the divided voltage to each tap. Voltage dividing resistances 63b and the resistance 64 divides the potential difference (VDD/2) between the fixed voltage VDD/2 and the ground GND, and outputs the divided voltage to each tap. The PMOS 65 or the NMOS 66 as selectively turned on, supplies the voltage having been outputted to the tap connected thereto, to the voltage output node Nout. Then, the operational amplifier 68 stabilizes the voltage at the node Nout and outputs it to the external portion.

As has been discussed, the D/A converter according to the second embodiment of the invention includes the fixed voltage supply means 67, which works to fix the voltage at the mid node N2 of the current path made up of a plurality of resistances 62, 63a, 63b, and 64. Consequently, even if there is difference between the width of the finished resistance 63a and that of the finished resistance 63b due to the step portion created between the P-type semiconductor substrate and the N-type well region formed thereon, each of resistances 63a may equally divide the potential difference (VDD/2) between the fixed voltage VDD/2 and the power source voltage VDD, while each of resistances 63b may equally divide the potential difference (VDD/2) between the fixed voltage VDD/2 and the ground GND. Thus, according to the D/A converter of the second embodiment, the distortion factor caused in the D/A conversion process can be suppressed to a sufficiently small value. Furthermore, since the D/A converter according to the second embodiment is provided with PMOS' 65 and NMOS' 66, there is no need to provide such a level shift circuit that is arranged in the D/A converter according to the first embodiment.

It should be noted that the invention is not limited to the embodiments as have been discussed above, and that various variations and modifications are possible without departing from the principle and spirit of the invention, the scope of which is recited in the appended claims. Some examples of the variation will be described in the following.

Figure 6:
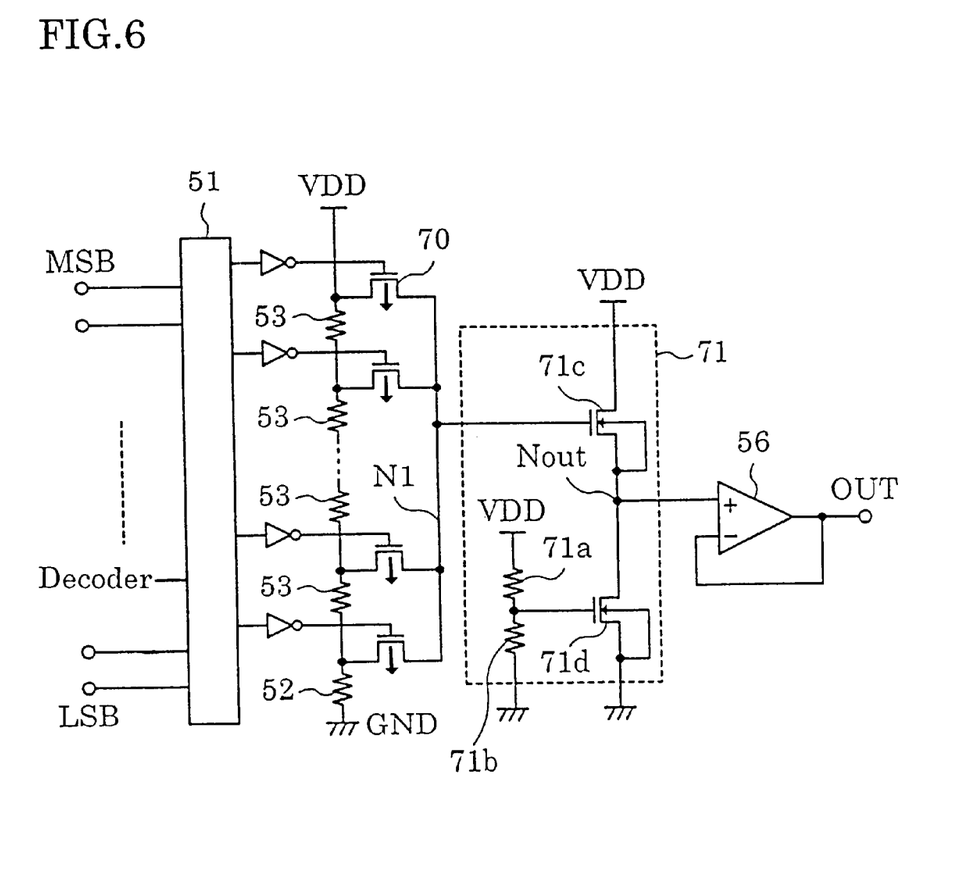
FIG. 6 is a diagram showing the configuration of a D/A converter resulting from variation of the above first embodiment according to the invention.

(1) FIG. 6 is a diagram showing a variation of the D/A converter according to the first embodiment. In this figure, the like constituents of the D/A converter according to the first embodiment are designated with the like reference numerals and signs.

In the D/A converter according to the first embodiment, all the transistors used as a switch are made up of a plurality of NMOS' 54, in order to form voltage dividing resistances having a uniform width even if the step portion is created between the P-type semiconductor substrate and the N-type well region formed thereon. In contrast to this, in the following variation, all the transistors used as a switch may be made up of a plurality of PMOS' 70 as shown in FIG. 6. A signal for selecting one of these PMOS' 70 is given to the gate of each PMOS 70 from the decoder 51 via a inverter. The voltage setting resistance 52 is not connected on the side of the power source voltage VDD but connected between the ground GND and the voltage dividing resistance 53. The voltage setting resistance 52 connecting its one end with the ground GND outputs, from its other end, the voltage (e.g. VDD/2) higher than the ground voltage GND. The voltage outputted to the voltage output node N1 from the voltage setting resistance 52 may be appropriately adjusted such that it can pass through the PMOS 70. However, there is the case where this voltage is too high to function as an analog voltage after the D/A conversion. Accordingly, as shown in FIG. 6, the D/A converter is provided with a level shift circuit 71 which works to lower the voltage having been outputted to the voltage output node N1 to an appropriate value. This level shift circuit 71 includes resistances 71a and 71b, and tow NMOS' 71c and 71d. Resistances 71a and 71b are connected in series with each other between the power source voltage VDD and the ground GND. The NMOS 71c connects its drain with the power source voltage VDD and also connects its gate with the node Nout. The NMOS 71d connects its drain with the source of the NMOS 71c and also connects its gate with the junction point between resistances 71a and 71b. The source of the NMOS 71d is connected with the ground GND while the drain of the same is connected with the non-inverting input terminal of the operational amplifier 60.

As has been described above, in the D/A converter shown in FIG. 6, all the switches are made up of PMOS' 70 which are formed in the N-type well region. Consequently, since the manufacturing condition with respect to all the voltage dividing resistances may be unified, the finished width thereof can be made uniform. Accordingly, in the D/A converter as shown in FIG. 6, the distortion factor caused in the D/A conversion process can be suppressed to a sufficiently small value in the same manner as in the D/A converter according to the first embodiment.

(2) In the D/A converters according to the first and second embodiments, the voltage dividing resistances 53, 63a, and 63b are made of poly-silicon. However, the same effect can be obtained when those resistances are formed by making use of the diffusion process i.e. surface deposition of $P^+$-type or $N^+$-type diffusant to the semiconductor substrate.

(3) In the D/A converter according to the second embodiment, if the amplitude of the analog voltage is between the ground voltage GND and the power source voltage VDD, there is no need for resistances 62 and 64 to be provided.

As has been described in detail in the above, according to the invention, there are made up of NMOS' all the switches which connect, depending on the decoding result, the voltage output node with taps which are provided on the current path made up of the voltage dividing resistances. Therefore, there is no need for the voltage dividing resistance to be formed near the N-type well region formed on the P-type semiconductor substrate. Consequently, even if the step portion is created between the P-type semiconductor substrate and the N-type well region formed thereon, the resistive values of voltage dividing resistances can not be made different from one another, thus there being realized the D/A conversion of a low distortion factor.

Furthermore, according to the invention, it is also possible to make up all the switches which connect, depending on the decoding result, the taps with the voltage output node by means of PMOS'. Therefore, the manufacturing condition of all the voltage dividing resistances may be unified, so that it is made possible to form the voltage dividing resistances having the uniform characteristic. Accordingly, the resistive values of voltage dividing resistances can not be different from one another, thus there being realized the D/A conversion of a low distortion.

Still further, the D/A converter according to the invention includes a plurality of the first voltage dividing resistances connected in series with each other between the mid node and the power source voltage, a plurality of the second voltage dividing resistances connected in series with each other between the mid node and the ground, a plurality of PMOS' outputting the voltage at the taps to the voltage output node, the taps being provided on the current path made up of the above first voltage dividing resistances, a plurality of NMOS' outputting the voltage at the taps to the voltage output node, the taps being provided on the current path made up of the above second voltage dividing resistances, and the fixed voltage supply means supplying the fixed voltage to the mid node. According to the configuration of the D/A converter as mentioned above, since the plural first voltage dividing resistances divide the voltage between the fixed voltage and the power source voltage while the plural second voltage dividing resistances divide the voltage between the fixed voltage and the ground voltage, even if there is difference between the resistive value of the first voltage dividing resistance and the same of the second voltage dividing resistance, there can be realized the D/A converter of a low distortion factor.

The entire disclosure of Japanese Patent Application No. 11-291949 filed on Oct. 14, 1999 including specification, claims and summary is incorporated herein by reference in its entirety.

What is claimed is:

1. A D/A converter that converts an input digital data into an analog voltage signal, comprising:
   a decoder that decodes the digital data;
   a first resistance group which is made up of a plurality of first resistances connected in series with each other via a plurality of first taps, that divides a voltage generated between a first power source and a mid node, and that outputs divided voltages from each of said first taps;
   a plurality of first transistors respectively coupled to each of said first taps, that supply the divided voltages from said first taps to a voltage output node in accordance with decode results of said decoder;
   a second resistance group which is made up of a plurality of second resistances connected in series with each other via a plurality of second taps, that divides a voltage generated between a second power source and said mid node, and that outputs divided voltages from each of said second taps;
   a plurality of second transistors respectively coupled to each of said second taps, that supply the divided voltages from said second taps to the voltage output node in accordance with the decode results of said decoder; and
   a fixed voltage supply that supplies the fixed voltage to said mid node.

2. The D/A converter as claimed in 1, wherein the fixed voltage is set to an average of the first power source voltage and the second power source voltage.

3. The D/A converter as claimed in claim 1, wherein all of said first transistors are N-channel type MOS transistors and all of said second transistors are P-channel type MOS transistors.

4. The D/A converter as claimed in claim 1, further comprising an amplifier that amplifies the analog voltage signal.

5. A digital-to-analog (D/A) converter, formed by using a semiconductor substrate, that converts an input digital data into an analog voltage signal, the D/A converter comprising:
   a decoder that decodes the digital data;
   a plurality of resistance elements connected in series between a first supply voltage node and a second supply voltage node, divided voltages being generated at one end of each of said resistance elements, said divided voltages including a first divided voltage and a second divided voltage having a voltage level lower than the first divided voltage;
   a plurality of switching elements, each of which being a P-channel type MOS transistor coupled between the one end of respective ones of said resistance elements and an output node, gate electrodes of said P-channel type MOS transistors receiving output signals of said decoder, said switching elements transmitting the divided voltages including said first and second divided voltages to the output node; and
   a voltage supply circuit that supplies a fixed voltage generated based on a voltage at said first supply voltage node, to the one end of a corresponding one of said resistance elements that is positioned substantially in a middle of said resistance elements, the fixed voltage being set between the voltage at said first supply voltage node and a voltage at said second supply voltage node.

6. The D/A converter of claim 5, wherein the fixed voltage is set to an average of the voltage at said first supply voltage node and the voltage at said second supply voltage node.

7. The D/A converter of claim 5, further comprising an amplifier that amplifies the analog voltage signal.

8. A digital-to-analog (D/A) converter, formed by using a semiconductor substrate, that converts an input digital data into an analog voltage signal, the D/A converter comprising:
   a decoder that decodes the digital data;
   a plurality of resistance elements connected in series between a first supply voltage node and a second supply voltage node, divided voltages being generated at one end of each of said resistance elements, said divided voltages including a first divided voltage and a second divided voltage having a level higher than the first divided voltage;
   a plurality of switching elements, each of which being an N-channel type MOS transistor coupled between the one end of respective ones of said resistance elements and an output node, gate electrodes of said N-channel type MOS transistors receiving output signals of said decoder, said switching elements transmitting the divided voltages including the first and second divided voltages to the output node; and
   a level shift circuit, including a transistor having a gate electrode with is coupled to the output node, that shifts the voltage at the output node to output the analog voltage signal in accordance with a voltage at the output node,
   said plurality of switching elements including only said N-channel type MOS transistors, wherein said plurality of resistance elements and said N-channel type MOS transistors are formed only in a P-type region of the semiconductor substrate.

9. The D/A converter of claim 8, further comprising a voltage setting resistance having one end thereof connected to the first supply voltage node, and that outputs from another end thereof to said resistance elements a set voltage having a voltage difference with respect to a voltage at the first supply voltage node,     wherein said second power source is ground and the voltage at the first supply voltage node is set higher than a voltage of the second supply voltage node, the set voltage being set to be between the voltage at the first supply voltage node and the voltage at the second supply voltage node.

10. The D/A converter of claim 9, wherein the set voltage is set in correspondence with a threshold voltage of said N-channel type MOS transistors.

11. The D/A converter of claim 8, further comprising an amplifier, coupled to said level shift circuit, that amplifies the analog voltage signal.

12. The D/A converter of claim 8, wherein each of said resistance elements have substantially a same width.

* * * * *